(12) United States Patent
Belling-Hoffmann et al.

(10) Patent No.: US 11,754,639 B2
(45) Date of Patent: Sep. 12, 2023

(54) MEASURING SYSTEM FOR DETECTING A PHYSICAL PARAMETER AND METHOD FOR OPERATING A MEASURING SYSTEM

(71) Applicant: Knorr-Bremse Systeme Fuer Nutzfahrzeuge GmbH, Munich (DE)

(72) Inventors: Michael Belling-Hoffmann, Renningen (DE); Christian Kaufmann, Sindelfingen (DE); Dominikus Drayss, Wallduern (DE); Alexander Rammert, Kornwestheim (DE)

(73) Assignee: KNORR-BREMSE SYSTEME FUER NUTZFAHRZEUGE GMBH, Munich (DE)

( * ) Notice: Subject to any disclaimer, the term of this patent is extended or adjusted under 35 U.S.C. 154(b) by 0 days.

(21) Appl. No.: 17/828,553

(22) Filed: May 31, 2022

(65) Prior Publication Data
US 2022/0381851 A1 Dec. 1, 2022

(30) Foreign Application Priority Data
Jun. 1, 2021 (DE) .................... 10 2021 114 097.8

(51) Int. Cl.
*G01R 31/52* (2020.01)
*G01R 15/04* (2006.01)
*G01R 19/00* (2006.01)

(52) U.S. Cl.
CPC ............. *G01R 31/52* (2020.01); *G01R 15/04* (2013.01); *G01R 19/0084* (2013.01)

(58) Field of Classification Search
CPC ..... G01R 31/52; G01R 15/04; G01R 19/0084; G01D 3/08; G01D 21/00; G01D 11/00
USPC ......................................................... 324/509
See application file for complete search history.

(56) References Cited

U.S. PATENT DOCUMENTS

2020/0169041 A1* 5/2020 Liang .................. H01R 13/641

FOREIGN PATENT DOCUMENTS

DE 102018220065 A1 5/2020

* cited by examiner

*Primary Examiner* — Farhana A Hoque
(74) *Attorney, Agent, or Firm* — NORTON ROSE FULBRIGHT US LLP; Gerard Messina

(57) ABSTRACT

A measuring system for detecting a physical parameter, includes a measuring sensor for detecting the physical parameter, which sensor has a first, second and at least one third terminal. The measuring system also includes a first power supply unit for outputting electrical energy to the measuring sensor with a first voltage with respect to a first ground potential via the first and the second terminal, and a second power supply unit for outputting electrical energy to the measuring sensor with a second voltage with respect to a second ground potential via the third and the second terminal or a fourth terminal. The first ground potential can differ from the second ground potential at least temporarily. The first power supply unit includes an additional voltage source via which the second terminal is electrically connected to the first ground potential.

9 Claims, 2 Drawing Sheets

MEASURING SYSTEM FOR DETECTING A PHYSICAL PARAMETER AND METHOD FOR OPERATING A MEASURING SYSTEM

RELATED APPLICATION INFORMATION

The present application claims priority to and the benefit of German patent application no. 10 2021 114 097.8, which was filed in Germany on Jun. 1, 2021, the disclosure of which is incorporated herein by reference.

FIELD OF THE INVENTION

The present invention is based on a measuring system or a method of the type described in the descriptions herein. The subject matter of the present invention is also a related method, a computer program, and a computer readable medium having a computer program.

BACKGROUND INFORMATION

In modern sensor systems, especially those installed in vehicles, it should be ensured that these sensor systems are as well protected as possible against failure of system components. For this purpose, it is often customary to provide redundant systems or power supply units which supply a measuring sensor with energy, so that in the event of a failure of such a power supply system, a redundant power supply system is activated to supply the measuring sensor with energy. However, a problem arises if the power supply systems have a different ground reference, which means that the measuring sensor is at least temporarily not supplied with a voltage within the tolerated range and thus, if the active power supply system is changed, it may provide either no or incorrect measurement values.

SUMMARY OF THE INVENTION

Against this background, in the approach presented here, a measuring system, a method for operating this measuring system, and finally, a corresponding computer program in accordance with the independent claims, are presented. The measures listed in the dependent claims enable advantageous refinements and improvements to the measuring system specified in the independent claim.

Therefore, a measuring system for detecting a physical parameter is presented, the measuring system having the following features:
  a measuring sensor for detecting the physical parameter, the measuring sensor having a first terminal, a second terminal, at least one third terminal;
  a first power supply unit for outputting electrical energy to the measuring sensor via the first terminal and the second terminal, the first power supply unit being configured to output the electrical energy to the measuring sensor with a first voltage with respect to a first ground potential; and
  a second power supply unit for outputting electrical energy to the measuring sensor via the third terminal and the second terminal or a fourth terminal, the second power supply unit being configured to output the electrical energy to the measuring sensor with a second voltage with respect to a second ground potential, in particular wherein the first ground potential differs from the second ground potential at least temporarily, wherein the first power supply unit has an additional voltage source, the second terminal of the measuring sensor being electrically connected to the first ground potential via the additional voltage source.

A physical parameter can be understood, for example, as a physical variable such as a rotation rate, an acceleration, a temperature or the like. For example, a power supply unit can be a unit that provides electrical energy to the measuring sensor in the form of a current and/or a voltage. In this case, the first power supply unit and the second power supply unit can be referenced to different ground potentials, for example due to electrical isolation or due to long electrical connecting cables between these ground potentials, which act as electrical resistances and cause the ground potentials to differ from each other when conducting an electrical current. The first power supply unit can act as a primary power supply unit. The second power supply unit can function as a redundant power supply unit. The first power supply unit can comprise a control unit, such as an electropneumatic modulator or similar, or may be part of the same. The second power supply unit can comprise or be part of a control unit.

The approach proposed here is based on the insight that an additional voltage source for potential raising can be used to improve a monitoring function for a diagonal supply of measuring sensors, in particular active rotation rate sensors. In contrast to conventional electrical circuits, according to embodiments, a measuring sensor, for example an active rotation rate sensor, can be read out and monitored in parallel by two control units, even in the event of ground offsets between the two control units. The additional voltage source can prevent a negative voltage from being generated due to ground offsets, which would prevent sensor voltages from being detected. This means that reliable sensor data for a brake system can be obtained regardless of ground offsets, for example with respect to a wheel speed, thus allowing operational safety to be increased. A diagonal supply and the reading of actively detected rotation rates can be used in an advantageous way for automated and autonomous driving, due to the secure sensor data acquisition. With regard to the ground offset, the additional voltage source can be used for potential raising. For example, it can be assumed that ground offsets of up to +/−3 V may occur, where other values are also possible. The additional voltage source can raise the reference ground of the measuring system with respect to the first ground potential. In the second power supply unit or the second control unit, this can in particular increase a feedback signal at a control unit in the ground path. By adapting a resistance network to the new reference potential, a measuring range can therefore be shifted, for example. In addition, an improved thermal equilibrium of the measuring system can be advantageously achieved, as in particular it allows a linear regulator in the second power supply unit to be relieved.

By raising the reference potential, new fault patterns can be detected which considerably simplify the coordination between the control units. A short circuit to ground, for example, can now be detected automatically by the second control unit and the dead time in the transition to the redundancy mode is reduced. In addition, the ground raising of the other control unit could provide information about the activities occurring. If actuators are activated, braking/ABS control is an obvious choice. These relationships could be used to initiate suitable measures, such as biasing a backup cable, which would accelerate the transition from the primary to the secondary control unit.

According to one embodiment, the first power supply unit can comprise a first voltage source for the first voltage and a first control device. The first terminal of the measuring sensor can be electrically connected to the first voltage source and to the first control device. In particular, the first control device can be electrically connected via a first voltage divider to the first terminal of the measuring sensor and the first ground potential. Such an embodiment of the approach proposed here offers the advantage that supplying the electrical energy to the measuring sensor and reading in measurement values can be implemented in a simple manner.

The first power supply unit can also comprise a first amplification device and a second control device. The second terminal of the measuring sensor can be electrically connected to the first amplification device and to the second control device. In particular, the second control device can be electrically connected via a second voltage divider to the second terminal of the measuring sensor and the first ground potential. The amplification device may be an operational amplifier, differential amplifier, or similar. Such an embodiment of the approach proposed here has the advantage that reliable and accurate measurement values can be acquired.

In addition, the second power supply unit can comprise a second voltage source for the second voltage, a second amplification device, and a third control device. In this case, the third terminal of the measuring sensor can be electrically connected to the second voltage source, to the second amplification device and to the third control device. In particular, the third control device can be electrically connected via a third voltage divider to the third terminal of the measuring sensor and the second ground potential. Such an embodiment of the approach proposed here offers the advantage that it enables a secure diagonal supply of the measuring sensor and an accurate detection of the physical parameter.

In addition, the second power supply unit can comprise a fourth control device. In this case, the second or fourth terminal of the measuring sensor can be electrically connected to the fourth control device. In particular, this fourth control device can be electrically connected via a fourth voltage divider to the second or fourth terminal of the measuring sensor and to the second ground potential. Such an embodiment of the approach proposed here offers the advantage that a robust configuration of the measuring system can be achieved in a simple way.

Also, according to a specific embodiment, the measuring sensor can be configured as a rotation rate sensor, in particular to detect a rotation speed of a vehicle component and/or a vehicle wheel. Such an embodiment of the approach proposed here offers the advantage of being able to guarantee reliable and robust measurement of the physical parameter by the measuring sensor, particularly in an environment with high safety requirements.

Also, in accordance with one embodiment of the approach proposed here, a method is proposed for operating a measuring system in accordance with a variant of the approach presented here, the method comprising the following steps:
supplying the measuring sensor with electrical energy from the first and/or second power supply unit; and
outputting a measuring signal by the measuring sensor, the measuring signal representing the physical parameter.

The aforementioned advantages can also be realized in a technically simple way by such an embodiment in the form of a method, so that the physical parameter can be detected and used with a high degree of safety and robustness.

Also advantageous is a computer program product or computer program with program code, which can be stored on a machine-readable medium or storage medium, such as a semiconductor memory, a hard drive or an optical storage device, and is used to carry out, implement and/or control the steps of the method according to any one of the embodiments described above, in particular when the program product or program is executed on a computer or a device.

Exemplary embodiments of the approach presented here are shown in the drawings and explained in more detail in the following description.

BRIEF DESCRIPTIONS OF THE DRAWINGS

DETAILED DESCRIPTION

Figure 1:
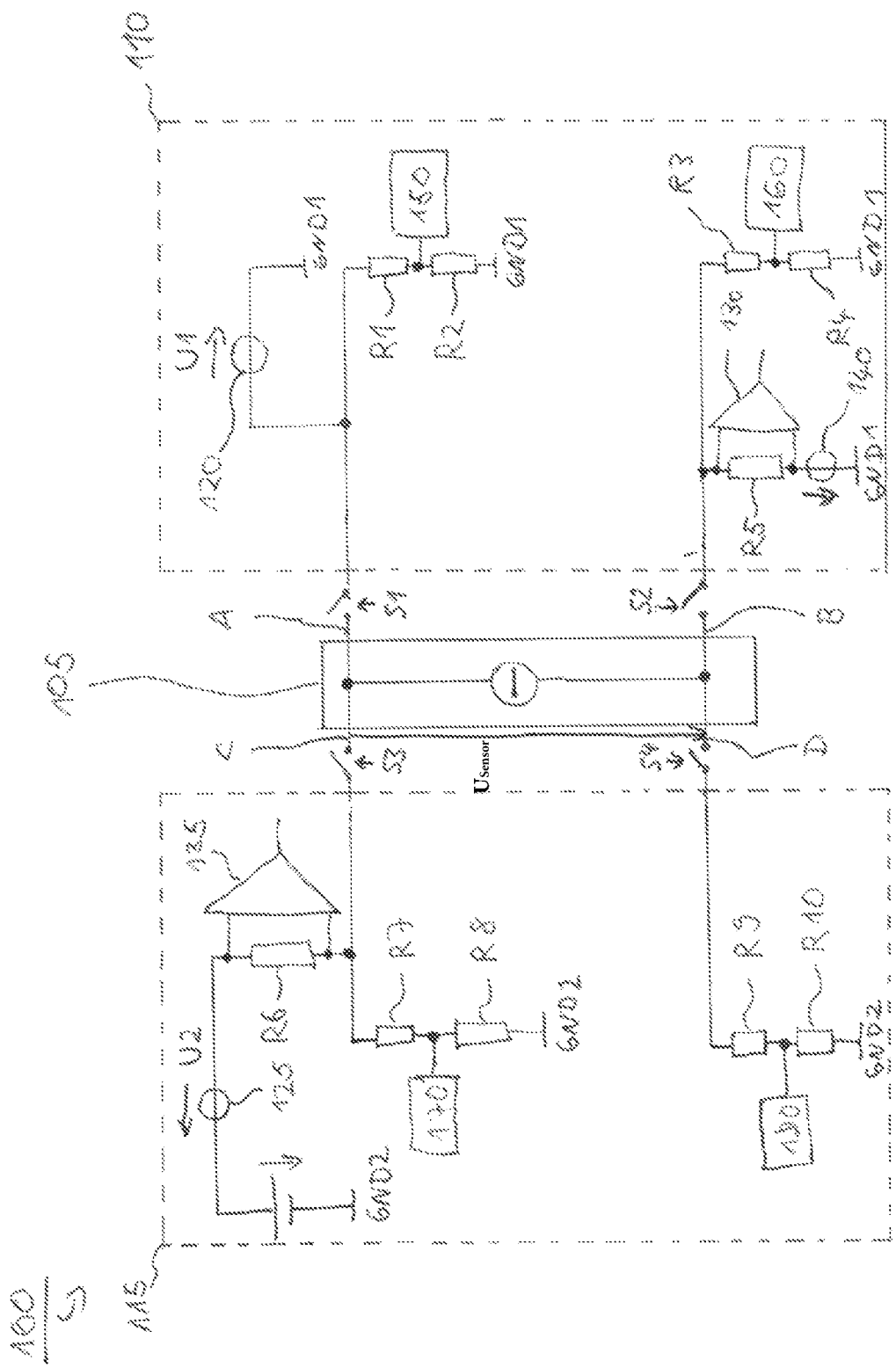
FIG. 1 shows a block circuit diagram of an exemplary embodiment of the measuring system presented here, in the wiring configuration for normal operation.

In the following description of advantageous exemplary embodiments of the present invention, identical or similar reference numerals are used for elements shown in the various figures which have similar functions, wherein no repeated description of these elements is given.

FIG. 1 shows a block circuit diagram of an exemplary embodiment of the measuring system 100 presented here for detecting a physical parameter. The measuring system 100 comprises a measuring sensor 105, which is supplied with electrical energy from a first power supply unit 110 and/or with electrical energy from a second power supply unit 115. The measuring sensor 105 is configured to detect the physical parameter.

The measuring sensor 105 can be configured, for example, as a sensor for a physical variable or physical parameter, such as a rotation rate of a vehicle wheel. It is also conceivable, however, that the measuring sensor 105 is configured as a sensor for a temperature, an acceleration, a pressure or the like. The first power supply unit 110 comprises a control unit or primary control unit, purely as an example an electropneumatic modulator, or is configured as part of the same. The second power supply unit 115 comprises a further control unit or redundant control unit.

The measuring sensor 105 is electrically connected between the first power supply unit 110 and the second power supply unit 115. The measuring sensor 105 comprises a first terminal A, a second terminal B, a third terminal C, and a fourth terminal D. In the exemplary embodiment shown in FIG. 1, the second terminal is electrically conductively connected to the fourth terminal. The measuring sensor 105 is electrically connected to the power supply units 110 and 115 via the terminals A, B, C and D.

The first power supply unit 110 is configured to output electrical energy to the measuring sensor 105 via a first switch S1 to the first terminal A and a second switch S2 to the second terminal B. The first power supply unit 110 is configured to output the electrical energy to the measuring sensor 105 with a first voltage U1 with respect to a first ground potential GND1. The first power supply unit 110 comprises an additional voltage source 140, via which the second terminal B of the measuring sensor 105 is electrically connected to the first ground potential GND1.

The second power supply unit 115 is configured to output electrical energy to the measuring sensor 105 via a third switch S3 to the third terminal C and a fourth switch S4 to the fourth terminal D. The second power supply unit 115 is configured to output the electrical energy to the measuring sensor 105 with a sensor voltage $U_{Sensor}$. The first ground potential GND1 can deviate at least temporarily from the second ground potential GND2. For example, this deviation may result from long electrical connecting cables between the ground potentials GND1 and GND2, which act as an electrical resistance and cause the ground potentials to differ from each other when conducting an electrical current.

According to the exemplary embodiment shown in FIG. 1, the first power supply unit 110 comprises a first voltage source 120 for the first voltage U1, a first amplification device 130, a first control device 150 (which can also operate as a regulating device), and a second control device 160 as well as a plurality of electrical resistors R1, R2, R3, R4 and R5. Furthermore, according to the exemplary embodiment shown in FIG. 1, the second power supply unit 115 comprises a second voltage source 125 for the second voltage U2, a second amplification device 135, a third control device 170, and a fourth control device 180 as well as a plurality of electrical resistors R6, R7, R8, R9 and R10. The amplification devices 130 and 135 are configured, for example, as differential amplifiers, operational amplifiers or the like.

The first voltage source 120 of the first power supply unit 110 is configured to provide the first voltage U1 relative to the first ground potential GND1. The first terminal A of the measuring sensor 105 is electrically connected to the first voltage source 120 and to the first control device 150. The first voltage source 120 is electrically wired between the first ground potential GND1 and the first terminal A. The first control device 150 is electrically connected to the first terminal A of the measuring sensor 105 and to the first ground potential GND1 via a first voltage divider comprising a first electrical resistor R1 and a second electrical resistor R2. The first voltage divider or the electrical resistors R1 and R2 are electrically connected between the first ground potential GND1 and the first terminal A. The first control device 150 is electrically connected to a tap-off point between the electrical resistors R1 and R2.

The first amplification device 130 and the second control device 160 of the first voltage source 120 are electrically connected to the second terminal B of the measuring sensor 105. In addition, the additional voltage source 140 is electrically connected to the second terminal B of the measuring sensor 105. The first amplification device 130 and the additional voltage source 140 are electrically connected between the first ground potential GND1 and the second terminal B. In addition, the first amplification device 130 is electrically connected between the additional voltage source 140 and the second terminal B. A fifth electrical resistor R5 is electrically connected between two terminals of the first amplification device 130. The second control device 160 is electrically connected to the second terminal B of the measuring sensor 105 and to the first ground potential GND1 via a second voltage divider comprising a third electrical resistor R3 and a fourth electrical resistor R4. The second voltage divider or the electrical resistors R3 and R4 are electrically connected between the first ground potential GND1 and the second terminal B. The second control device 160 is electrically connected to a tap-off point between the electrical resistors R3 and R4.

The second voltage source 125 of the second power supply unit 115 is configured to provide the sensor voltage $U_{Sensor}$. The third terminal C of the measuring sensor 105 is electrically connected to the second voltage source 125, to the second amplification device 135, and to the third control device 170. The second voltage source 125 is electrically connected between the second ground potential GND2 and the second amplification device 135. A sixth electrical resistor R6 is electrically connected between two terminals of the second amplification device 135. The third control device 170 is electrically connected to the third terminal C of the measuring sensor 105 and to the second ground potential GND2 via a third voltage divider comprising a seventh electrical resistor R7 and an eighth electrical resistor R8. The third voltage divider or the electrical resistors R7 and R8 are electrically connected between the second ground potential GND2 and the third terminal C. The third control device 170 is electrically connected to a tap-off point between the electrical resistors R7 and R8.

The fourth control device 180 is electrically connected to the second terminal B or the fourth terminal D of the measuring sensor 105. The fourth control device 180 is electrically connected to the second terminal B or the fourth terminal D of the measuring sensor 105 and to the second ground potential GND2 via a fourth voltage divider comprising a ninth electrical resistor R9 and a tenth electrical resistor R10. The fourth voltage divider or the electrical resistors R9 and R10 are electrically connected between the second ground potential GND2 and the second terminal B or the fourth terminal D. The fourth control device 180 is electrically connected to a tap-off point between the electrical resistors R9 and R10.

Another possible configuration would be an exemplary embodiment not explicitly shown in FIG. 1, in which an amplifier circuit is used at the fourth terminal D, which corresponds, for example, to the amplifier circuit with the fifth resistor R5, the first amplification device 130 and the additional voltage source 140 at the first ground potential GND1. Alternatively or in addition, an amplifier circuit can also be used at the first terminal A, which corresponds, for example, to the amplifier circuit with the sixth resistor R6 and the second amplification device 135 at the third terminal C. By such a fully symmetrical configuration, further fault cases can be detected, handled, or compensated, for example.

In principle, it should be noted that the approach presented here can be used not only for sensors with two wires (i.e. four terminals for diagonal operation), but is also suitable for sensors with a different number of wires, wherein the sensor should have at least three inputs for the power supply in order to connect the different power supply modules, which are at different potentials, to the sensor with sufficient decoupling from each other.

For example, a sensor with different terminals can be used, for example, for the contacts VDD, GND, Sig, where VDD and GND are connected to both ECUs in the same way and a signal terminal Sig provides a measurement value. In addition, the signal "Sig" is routed to both ECUs.

Suppose this measurement signal Sig outputs a value that is between the levels of GND (e.g. 0 V) and VDD (e.g. 5 V). If the ECU A (for example, the first power supply unit 110) feeds the supply line VDD and measures a differential voltage of 2 V between VDD and Sig, then in ECU B (for example, in the second power supply unit 115) for example, a differential measurement value between GND and Sig with a value of (VDD−GND)−2V would be able to be measured at the same time. Therefore, with a static 5 V supply (between VDD and GND), a value of 3 V would be measured in ECU B. If there was a ground offset between the two ECUs, this would also be reflected in the measurement signals. Therefore, for a precise determination of the physical variable, a facility should be provided such that the ground offset in the system can be measured.

Figure 2:
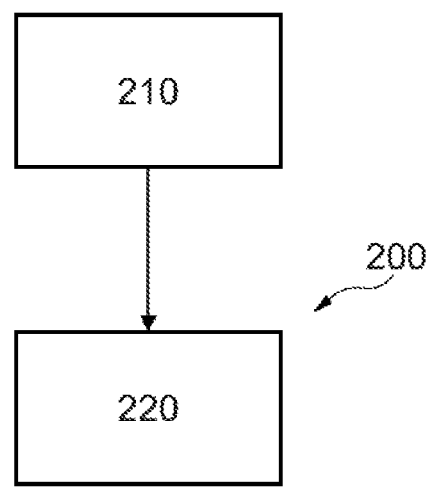
FIG. 2 shows a flowchart of an exemplary embodiment of the approach presented here as a method for operating a variant of a measuring system described here.

FIG. 2 shows a flowchart of an exemplary embodiment of the approach presented here as a method 200 for operating a variant of a measuring system described here. The measuring system from FIG. 1 or a similar measuring system can be advantageously operated by carrying out the method 200 for operation. The method 200 comprises a step 210 of supplying the measuring sensor with electrical energy from the first and/or second power supply unit. Furthermore, the method 200 comprises a step 220 of outputting a measuring signal, which represents the physical parameter, by the measuring sensor.

If an exemplary embodiment comprises an "and/or" association between a first and a second feature, this should be read as meaning that the exemplary embodiment according to one embodiment has both the first feature and the second feature and in accordance with another exemplary embodiment, it has either only the first or only the second feature.

THE LIST OF REFERENCE SIGNS IS AS FOLLOWS 100 measuring system
105 measuring sensor
110 first power supply unit
115 second power supply unit
120 first voltage source
125 second voltage source
130 first amplification device
135 second amplification device
140 additional voltage source
150 first control device
160 second control device
170 third control device
180 fourth control device
A first terminal
B second terminal
C third terminal
D fourth terminal
GND1 first ground potential
GND2 second ground potential
R1 first resistor
R2 second resistor
R3 third resistor
R4 fourth resistor
R5 fifth resistor
R6 sixth resistor
R7 seventh resistor
R8 eighth resistor
R9 ninth resistor
R10 tenth resistor
S1 first switch
S2 second switch
S3 third switch
S4 fourth switch
U1 first voltage
U2 second voltage
$U_{Sensor}$ sensor voltage
200 Method for operating a measuring system according to a variant presented here
210 supplying step
220 outputting step

What is claimed is:

1. A measuring system for detecting a physical parameter, comprising:
a measuring sensor for detecting the physical parameter, the measuring sensor having a first terminal, a second terminal, and at least one third terminal;
a first power supply unit for outputting electrical energy to the measuring sensor via the first terminal and the second terminal, the first power supply unit being configured to output the electrical energy to the measuring sensor with a first voltage with respect to a first ground potential; and
a second power supply unit for outputting electrical energy to the measuring sensor via the third terminal and the second terminal or a fourth terminal, the second power supply unit being configured to output the electrical energy to the measuring sensor with a second voltage with respect to a second ground potential, and wherein the first ground potential differs from the second ground potential at least temporarily;
wherein the first power supply unit has an additional voltage source, the second terminal of the measuring sensor being electrically connected to the first ground potential via the additional voltage source.

2. The measuring system of claim 1, wherein the first power supply unit includes a first voltage source for the first voltage and a first control device, the first terminal of the measuring sensor being electrically connected to the first voltage source and to the first control device, and wherein the first control device is electrically connected via a first voltage divider to the first terminal of the measuring sensor and to the first ground potential.

3. The measuring system of claim 1, wherein the first power supply unit includes a first amplification device and a second control device, the second terminal of the measuring sensor being electrically connected to the first amplification device and the second control device, and wherein the second control device is electrically connected via a second voltage divider to the second terminal of the measuring sensor and to the first ground potential.

4. The measuring system of claim 1, wherein the second power supply unit includes a second voltage source for the second voltage, a second amplification device and a third control device, the third terminal of the measuring sensor being electrically connected to the second voltage source, to the second amplification device and the third control device, and wherein the third control device is electrically connected via a third voltage divider to the third terminal of the measuring sensor and to the second ground potential.

5. The measuring system of claim 1, wherein the second power supply unit includes a fourth control device, the second terminal or the fourth terminal of the measuring sensor being electrically connected to the fourth control device, and wherein the fourth control device is electrically connected via a fourth voltage divider to the second terminal or the fourth terminal of the measuring sensor and to the second ground potential.

6. The measuring system of claim 1, wherein the measuring sensor includes a rotation rate sensor to detect a rotation speed of a component of a vehicle and/or a wheel of a vehicle.

7. A method for operating a measuring system for detecting a physical parameter, the method comprising:
supplying the measuring sensor with electrical energy from a first and/or second power supply unit, wherein the measuring system includes:
a measuring sensor for detecting the physical parameter, the measuring sensor having a first terminal, a second terminal, and at least one third terminal;
the first power supply unit for outputting electrical energy to the measuring sensor via the first terminal and the second terminal, the first power supply unit being configured to output the electrical energy to the measuring sensor with a first voltage with respect to a first ground potential; and the second power supply unit for outputting electrical energy to the measuring sensor via the third terminal and the second terminal or a fourth terminal, the second power supply unit being configured to output the electrical energy to the measuring sensor with a second voltage with respect to a second ground potential, and wherein the first ground potential differs from the second ground potential at least temporarily;

wherein the first power supply unit has an additional voltage source, the second terminal of the measuring sensor being electrically connected to the first ground potential via the additional voltage source; and outputting a measuring signal by the measuring sensor, the measuring signal representing the physical parameter.

8. A non-transitory computer readable medium having a computer program, which is executable by a processor, comprising:

a program code arrangement having program code for operating a measuring system for detecting a physical parameter, by performing the following:

supplying the measuring sensor with electrical energy from a first and/or second power supply unit, wherein the measuring system includes:

a measuring sensor for detecting the physical parameter, the measuring sensor having a first terminal, a second terminal, and at least one third terminal;

the first power supply unit for outputting electrical energy to the measuring sensor via the first terminal and the second terminal, the first power supply unit being configured to output the electrical energy to the measuring sensor with a first voltage with respect to a first ground potential; and the second power supply unit for outputting electrical energy to the measuring sensor via the third terminal and the second terminal or a fourth terminal, the second power supply unit being configured to output the electrical energy to the measuring sensor with a second voltage with respect to a second ground potential, and wherein the first ground potential differs from the second ground potential at least temporarily;

wherein the first power supply unit has an additional voltage source, the second terminal of the measuring sensor being electrically connected to the first ground potential via the additional voltage source; and outputting a measuring signal by the measuring sensor, the measuring signal representing the physical parameter.

9. The computer readable medium of claim 8, wherein the first power supply unit includes a first voltage source for the first voltage and a first control device, the first terminal of the measuring sensor being electrically connected to the first voltage source and to the first control device, and wherein the first control device is electrically connected via a first voltage divider to the first terminal of the measuring sensor and to the first ground potential.

* * * * *